US012426257B2

(12) United States Patent
Liu

(10) Patent No.: US 12,426,257 B2
(45) Date of Patent: Sep. 23, 2025

(54) SEMICONDUCTOR DRAM DEVICE STRUCTURE AND METHOD FOR FORMING SAME

(71) Applicant: CHANGXIN MEMORY TECHNOLOGIES, INC., Hefei (CN)

(72) Inventor: Xiang Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 735 days.

(21) Appl. No.: 17/830,634

(22) Filed: Jun. 2, 2022

(65) Prior Publication Data
US 2023/0070090 A1   Mar. 9, 2023

Related U.S. Application Data

(63) Continuation of application No. PCT/CN2021/138488, filed on Dec. 15, 2021.

(30) Foreign Application Priority Data

Sep. 7, 2021 (CN) .......................... 202111046005.4

(51) Int. Cl.
*H10B 12/00* (2023.01)
*H01L 21/762* (2006.01)

(52) U.S. Cl.
CPC ..... *H10B 12/482* (2023.02); *H01L 21/76224* (2013.01); *H10B 12/485* (2023.02)

(58) Field of Classification Search
CPC ................ H10B 12/482; H10B 12/485; H10B 12/0335; H01L 21/76224
See application file for complete search history.

(56) References Cited

U.S. PATENT DOCUMENTS

| | | | |
|---|---|---|---|
| 9,379,004 B1 | 6/2016 | Kwon | |
| 9,431,324 B2 | 8/2016 | Shin | |
| 9,515,022 B2 | 12/2016 | Kwon | |
| 9,761,593 B2 | 9/2017 | Shin | |
| 10,804,277 B2 | 10/2020 | Kim | |
| 11,183,500 B2 | 11/2021 | Song | |
| 2015/0294923 A1 | 10/2015 | Shin | |
| 2016/0027727 A1 | 1/2016 | Kim et al. | |

(Continued)

FOREIGN PATENT DOCUMENTS

| | | | |
|---|---|---|---|
| CN | 105280608 A | 1/2016 | |
| CN | 105719998 A | 6/2016 | |

(Continued)

*Primary Examiner* — Sonya McCall-Shepard
(74) *Attorney, Agent, or Firm* — Kilpatrick Townsend & Stockton LLP

(57) ABSTRACT

The embodiments of the disclosure provide a semiconductor structure and a method for forming the same. The method includes that: a substrate is provided; bit line contact holes arranged at intervals, a bit line contact in partial contact with the bit line contact hole and a bit line structure are formed on the substrate; a first insulating layer is formed on surfaces of the substrate, the bit line contact hole, the bit line contact and the bit line structure, the first insulating layer not completely filling the bit line contact holes; a second insulating layer is formed on a surface of the first insulating layer located on the surface of the bit line contact and part of the surface of the bit line structure; and a third insulating layer covering the first insulating layer and the second insulating layer is formed.

9 Claims, 26 Drawing Sheets

(56) References Cited

U.S. PATENT DOCUMENTS

| | | |
|---|---|---|
| 2016/0181143 A1 | 6/2016 | Kwon et al. |
| 2016/0276273 A1 | 9/2016 | Kwon et al. |
| 2016/0329338 A1 | 11/2016 | Shin |
| 2018/0166450 A1 | 6/2018 | Kim et al. |
| 2020/0373306 A1 | 11/2020 | Kim et al. |
| 2021/0035983 A1 | 2/2021 | Song et al. |
| 2021/0375764 A1 | 12/2021 | Song et al. |
| 2022/0052057 A1 | 2/2022 | Song et al. |

FOREIGN PATENT DOCUMENTS

| | | |
|---|---|---|
| CN | 108206184 A | 6/2018 |
| CN | 108231773 A | 6/2018 |
| CN | 112310080 A | 2/2021 |
| CN | 112447602 A | 3/2021 |

SEMICONDUCTOR DRAM DEVICE STRUCTURE AND METHOD FOR FORMING SAME

CROSS-REFERENCE TO RELATED APPLICATION

The present application is a U.S. continuation application of International Application No. PCT/CN2021/138488, filed on Dec. 15, 2021, which claims priority to Chinese patent application No. 202111046005.4, filed on Sep. 7, 2021. International Application No. PCT/CN2021/138488 and Chinese patent application No. 202111046005.4 are incorporated herein by reference in their entireties.

TECHNICAL FIELD

The disclosure relates to the technical field of semiconductors, and to, but is not limited to, a semiconductor structure and a method for forming the same.

BACKGROUND

A Dynamic Random Access Memory (DRAM) is a commonly used semiconductor memory device in computers. The DRAM includes a large number of repeated memory cells. Each memory cell typically includes a capacitor and a transistor. Herein, a gate of the transistor is connected to a word line, a drain area or a source area of the transistor is connected to a bit line, and the source area or the drain area of the transistor is connected to the capacitor. A voltage signal is applied to the word line to allow the control of turn-on or turn-off of the transistor, thereby reading data information stored in the capacitor through the bit line or writing the data information into the capacitor through the bit line for storage.

With high integration of semiconductor memory devices, the distance between conductive structures becomes shorter, thereby increasing parasitic capacitance.

SUMMARY

Embodiments of the disclosure provide a semiconductor structure and a method for forming the same.

According to a first aspect, the embodiments of the disclosure provide a method for forming a semiconductor structure, including the following operations.

A substrate is provided.

Bit line contact holes arranged at intervals, a bit line contact in partial contact with the bit line contact hole and a bit line structure are formed on the substrate.

A first insulating layer is formed on a surface of the substrate, a surface of the bit line contact holes, a surface of the bit line contact and a surface of the bit line structure. Herein, the first insulating layer does not completely fill the bit line contact hole.

A second insulating layer is formed on a surface of the first insulating layer located on the surface of the bit line contact and part of the surface of the bit line structure.

A third insulating layer covering the first insulating layer and the second insulating layer is formed.

According to a second aspect, the embodiments of the disclosure provide a semiconductor structure. The semiconductor structure includes a substrate; bit line contact holes arranged at intervals, a bit line contact in partial contact with the bit line contact hole and a bit line structure located on the substrate; a first insulating layer located on a surface of the substrate, a surface of the bit line contact hole, a surface of the bit line contact and a surface of the bit line structure, the first insulating layer not completely filling the bit line contact holes; a second insulating layer on a surface of the first insulating layer on the surface of the bit line contact and part of the surface of the bit line structure; and a third insulating layer on the surfaces of the first insulating layer and the second insulating layer.

According to a third aspect, the embodiments of the disclosure provide a semiconductor structure. The semiconductor structure includes: a substrate; bit line contact holes arranged at intervals, a bit line contact in partial contact with the bit line contact hole and a bit line structure located on the substrate; an insulating layer located on two sidewalls of the bit line contact and the bit line structure, the insulating layer including a first insulating layer, a second insulating layer and a third insulating layer which are stacked in sequence, and the insulating layer at least on a first sidewall including the first insulating layer, the second insulating layer and the third insulating layer whose heights decrease in sequence; a storage node contact located between adjacent third insulating layers; a landing pad covering the storage node contact and the surface of the insulating layer on the first sidewall, the landing pad being in electrical connection with the storage node contact; and an isolation structure located between adjacent landing pads and on surfaces of the landing pads.

BRIEF DESCRIPTION OF THE DRAWINGS

In the drawings (which are not necessarily drawn to scale), similar drawing reference signs may represent similar elements in different views. Similar drawing reference signs with different letter suffixes may represent different examples of similar elements. The drawings generally illustrate the various embodiments discussed herein by way of examples rather than limitation.

DETAILED DESCRIPTION

Figure 1A:
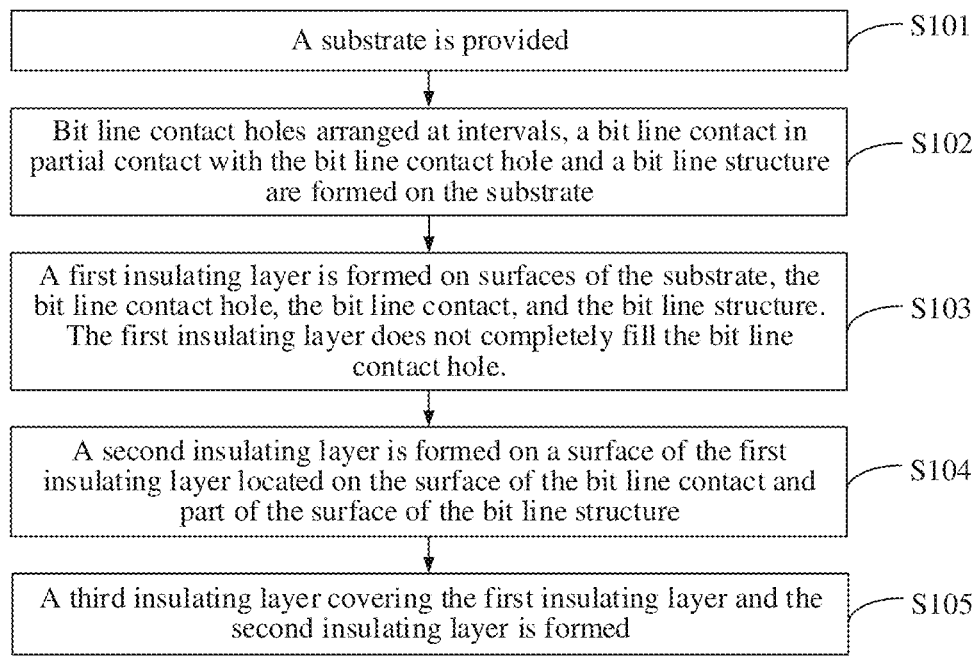
FIG. 1a shows a flowchart of a method for forming a semiconductor structure according to an embodiment of the disclosure.

Exemplary implementation modes of the disclosure will be described below more comprehensively with reference to the drawings. Although the exemplary implementation modes of the disclosure are shown in the drawings, it should be understood that, the disclosure may be implemented in various forms and should not be limited by the specific implementation modes elaborated herein. On the contrary, these implementation modes are provided to enable a more thorough understanding of the disclosure and to fully convey the scope of the disclosure of the disclosure to those skilled in the art.

A number of specific details are given below to provide a more thorough understanding of the disclosure. However, it is apparent to those skilled in the art that the disclosure may be implemented without one or more of these details. In other examples, to avoid confusion with the disclosure, some technical features well known in the art are not described. Namely, not all the features of the actual embodiments are described here, whereas well-known functions and structures are not described in detail.

The embodiments of the disclosure provide a method for forming a semiconductor structure as shown in FIG. 1a. The method includes the following steps.

At S101, a substrate is provided.

Here, the substrate may be a silicon (Si) substrate, a germanium (Ge) substrate, a silicon-germanium (SiGe) substrate, a gallium arsenide substrate, a ceramic substrate, a quartz substrate, or a glass substrate applied to a display, and may also include a plurality of layers, such as a silicon-on-insulator (SIO) substrate, or a germanium-on-insulator (GOI) substrate.

Shallow Trench Isolation (STI) may also be formed within the substrate, to isolate a plurality of active areas in the substrate. The STI may be formed by forming a trench in the substrate and then filling the trench with a layer of isolation material. The material filled in the STI may include silicon nitride or silicon oxide etc. Silicon oxide may be formed by thermal oxidation. The STI may isolate a plurality of active areas in an array or other type of distribution in the substrate.

At S102, bit line contact holes arranged at intervals, a bit line contact in partial contact with the bit line contact hole and a bit line structure are formed on the substrate.

Here, there is a space within the bit line contact hole that is not occupied by the bit line contact. The bit line contact may connect the bit line structure with the active area. The material used for the bit line contact may include, but is not limited to, a conductive material such as polysilicon, for example, impurity-doped polysilicon or impurity-free polysilicon.

In practical applications, the bit line structure may include a diffusion barrier layer, a conductive layer, and an insulating capping layer. Herein, the diffusion barrier layer is located between the bit line contact and the conductive layer, and the insulating capping layer is located on the conductive layer. The diffusion barrier layer may insulate the conductive layer from the active area, while preventing metal ions in the conductive layer from entering the active area. It may be a single-layer structure, for example, a metal titanium layer, or a multilayer structure such as metallic titanium layers and titanium nitride layers.

In practical applications, the material of the conductive layer may be one or more selected from polysilicon, a metal silicide compound, a conductive metal nitride (for example, Titanium Nitride (TiN), Tantalum Nitride (TaN), Wolframium Nitride (WN)) and a metal (for example, Wolframium (W), Titanium (Ti), Tantalum (Ta)).

In practical applications, the material of the insulating capping layer may be one or more selected from an oxide, silicon nitride and silicon oxynitride, and may be formed by using a chemical vapor deposition process.

At S103, a first insulating layer is formed on surfaces of the substrate, the bit line contact hole, the bit line contact, and the Bit line structure. Herein, the first insulating layer does not completely fill the bit line contact holes.

Here, the material used for the first insulating layer may include, but is not limited to, silicon nitride, silicon oxynitride, etc. In some embodiments, to facilitate the control of the thickness of the first insulating layer, the first insulating layer may be formed by an atomic layer deposition process. In other embodiments, the first insulating layer may be formed by other processes, such as a physical vapor deposition process, a chemical vapor deposition process, a low pressure chemical vapor deposition process, a molecular layer deposition process, or plasma enhanced chemical vapor deposition process. The first insulating layer may be used to protect the bit line structure and the bit line contact (BLC) structure from damage during subsequent processes.

At S104, a second insulating layer is formed on a surface of the first insulating layer located on the surface of the bit line contact and part of the surface of the bit line structure.

Here, the second insulating layer may be an air gap and may also be an oxide layer. Herein, the material used for the oxide layer may be silicon oxide, and may be formed by the same process as that used to form the first insulating layer.

At S105, a third insulating layer covering the first insulating layer and the second insulating layer is formed.

Here, the material used for the third insulating layer may be the same as or different from the material used for the first insulating layer. The process for forming the third insulating layer may be the same as or different from the process for forming the first insulating layer.

By forming the first insulating layer on surfaces of the substrate, the bit line contact hole, the bit line contact, and the bit line structure, forming the second insulating layer on the surface of the first insulating layer located on the surface of the bit line contact and part of the surface of the bit line structure, and forming the third insulating layer covering the bit line structure, the first insulating layer and the second insulating layer, the embodiment of the disclosure provides a new method for forming a sidewall structure of a bit line (BL) and a bit line contact structure, through which parasitic capacitance from the bit line and the bit line contact to a storage node contact (SNC) can be reduced and reading capacity can be improved.

FIGS. 1B to 1e schematically show structures of forming a semiconductor structure according to an embodiment of the disclosure. Further description is made below to steps S102 to S105 with reference to FIGS. 1B to 1e.

Figure 1B:
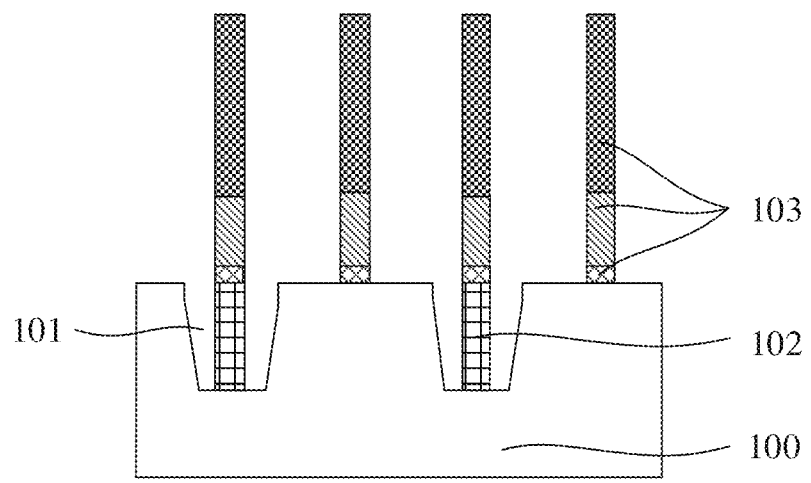
FIGS. 1b, 1c, 1d, 1e schematically show structures of forming a semiconductor structure according to an embodiment of the disclosure.

As shown in FIG. 1B, bit line contact holes 101 arranged at intervals, a bit line contact 102 in partial contact with the bit line contact hole 101 and a bit line structure 103 are formed on the substrate 100.

Figure 1C:
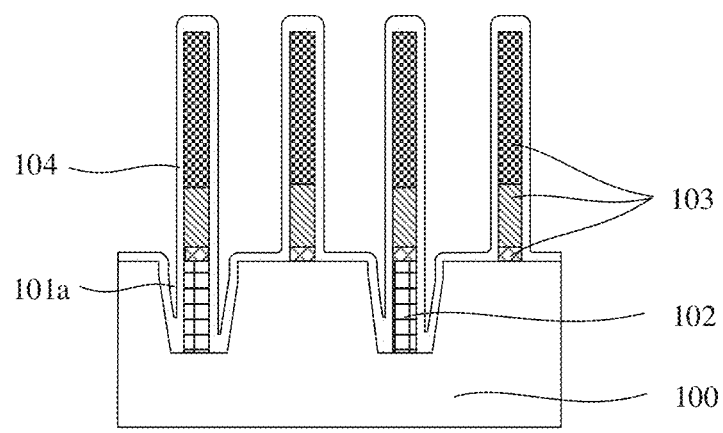

With reference to FIGS. 1B and 1c, a first insulating layer 104 as shown in FIG. 1c is formed on the surfaces of the substrate 100, the bit line contact holes 101, the bit line contact 102, and the bit line structure 103. A void 101a is formed while the first insulating layer 104 is formed. That is, the first insulating layer 104 does not completely fill the bit line contact hole 101 shown in FIG. 1B.

Figure 1D:
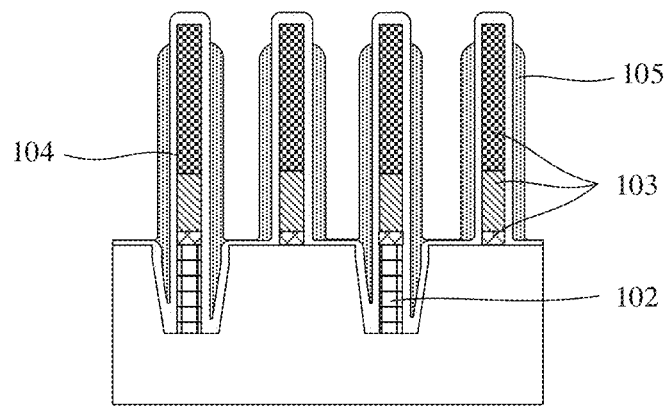

As shown in FIG. 1d, a second insulating layer 105 is formed on the surface of the first insulating layer 104 located on the surface of the bit line contact 102 and part of the surface of the bit line structure 103. At this time, the second insulating layer fills the void 101a shown in FIG. 1c, and thus the sidewall structure of the BL and the bit line contact is an N-O-N structure or an N-A-N structure. This may reduce the parasitic capacitance from the BL and the BLC to the SNC.

Figure 1E:
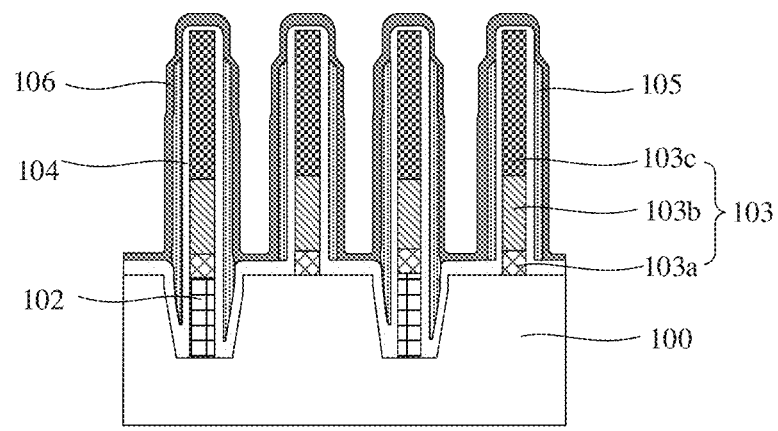

As shown in FIG. 1e, after the second insulating layer 105 is formed, a third insulating layer 106 covering the first insulating layer 104 and the second insulating layer 105 is formed by deposition.

In some embodiments, continuing to refer to FIG. 1e, the bit line structure 103 may include a diffusion barrier layer 103a, a conductive layer 103b, and an insulating capping layer 103c. The diffusion barrier layer 103a is located between the bit line contact 102 and the conductive layer 103b, and the insulating capping layer 103c is located on the conductive layer 103b.

Based on the method for forming a semiconductor structure as shown in FIG. 1a, the embodiments of the present disclosure provide a semiconductor structure. As shown in FIG. 1e, the structure includes: the substrate 100; the bit line contact holes arranged at intervals, the bit line contact 102 in partial contact with the bit line contact hole and the bit line structure 103 on the substrate 100; the first insulating layer 104 located on surfaces of the substrate 100, the bit line contact hole, the bit line contact 102, and the bit line structure 103, the first insulating layer not completely filling the bit line contact holes; the second insulating layer 105 on a surface of the first insulating layer 104 located on the surface of the bit line contact 102 and part of the surface of the bit line structure 103; and the third insulating layer 106 located on the surfaces of the first insulating layer 104 and the second insulating layer 105.

Figure 2A:
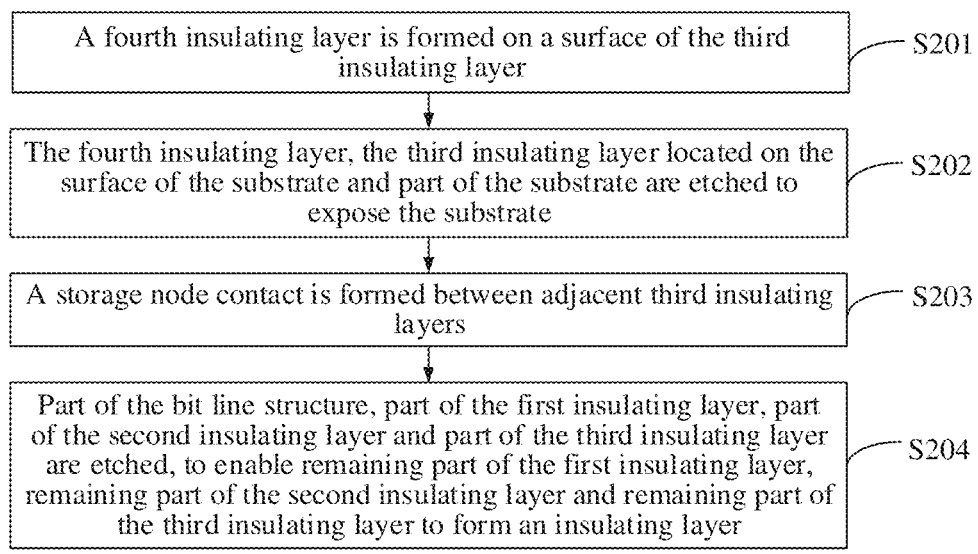
FIG. 2a shows another flowchart of a method for forming a semiconductor structure according to an embodiment of the disclosure.

The embodiments of the disclosure further provide a method for forming a semiconductor structure as shown in FIG. 2a. The method includes the following steps.

Steps S101 to S105 shown in FIG. 1a are included, and the following operations after S105 are further included.

At S201, a fourth insulating layer is formed on a surface of the third insulating layer.

Here, the fourth insulating layer serves to prevent, during subsequent etching, the third insulating layer on the surface of the bit line structure from being etched to further damage the insulating layer. The material used for the fourth insulating layer may include, but is not limited to, silicon nitride, silicon oxynitride, etc. The material used may be the same as the material used for the third insulating layer. The fourth insulating layer may be formed by an atomic layer deposition process, or by other processes, such as a physical vapor deposition process, a chemical vapor deposition process, a low pressure chemical vapor deposition process, a molecular layer deposition process, and plasma enhanced chemical vapor deposition process.

At S202, the fourth insulating layer, the third insulating layer located on the surface of the substrate and part of the substrate are etched to expose the substrate.

At S203, a storage node contact is formed between adjacent third insulating layers.

Here, the storage node contact may include impurity-doped polysilicon or impurity-free polysilicon.

At S204, part of the bit line structure, part of the first insulating layer, part of the second insulating layer and part of the third insulating layer are etched, to enable the remaining part of the first insulating layer, the remaining part of the second insulating layer and the remaining part of the third insulating layer to form an insulating layer.

In the embodiment of the disclosure, by forming the insulating layer between the bit line contact and the storage node contact, and including the first insulating layer, the second insulating layer and a third insulating layer in the insulating layer among the bit line, the bit line contact and the storage node contact, the parasitic capacitance from the bit line structure to the storage node contact is reduced.

References are made to FIGS. 2b to 2e for steps S201 to S204, respectively.

Figure 2B:
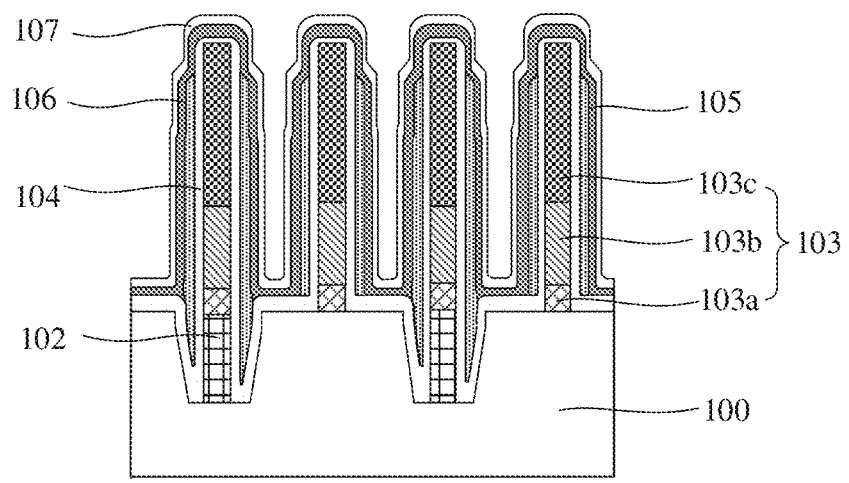
FIGS. 2b, 2c, 2d, 2e schematically show another structures of forming a semiconductor structure according to an embodiment of the disclosure.

As shown in FIG. 2b, a fourth insulating layer 107 is formed on the surface of the third insulating layer 106.

Figure 2C:
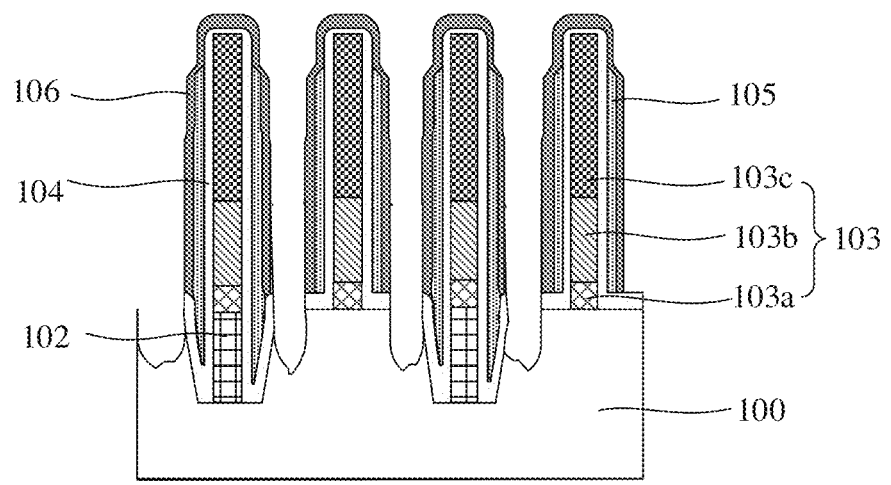

Referring to FIG. 2b, the fourth insulating layer 107, the third insulating layer 106 on the surface of the substrate 100 and part of the substrate 100 are etched to expose the substrate 100, forming a structure as shown in FIG. 2c.

Figure 2D:
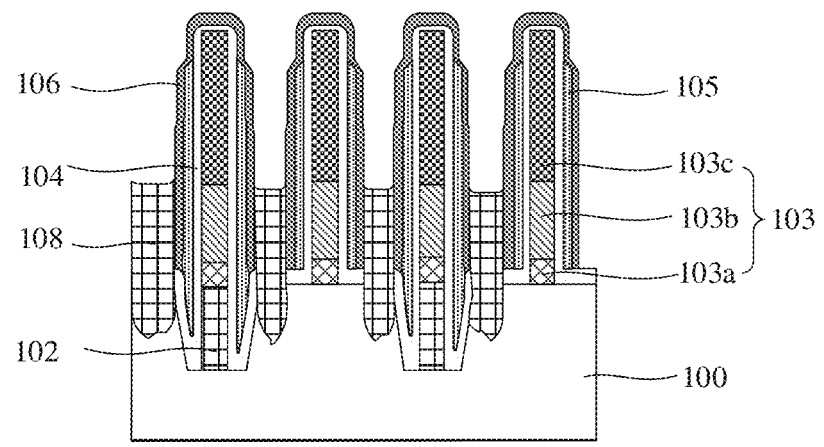

As shown in FIG. 2d, a storage node contact 108 is formed between adjacent third insulating layers 106. The storage node contacts 108 are spaced apart from each other, and each storage node contact 108 may have a concave top surface.

Figure 2E:
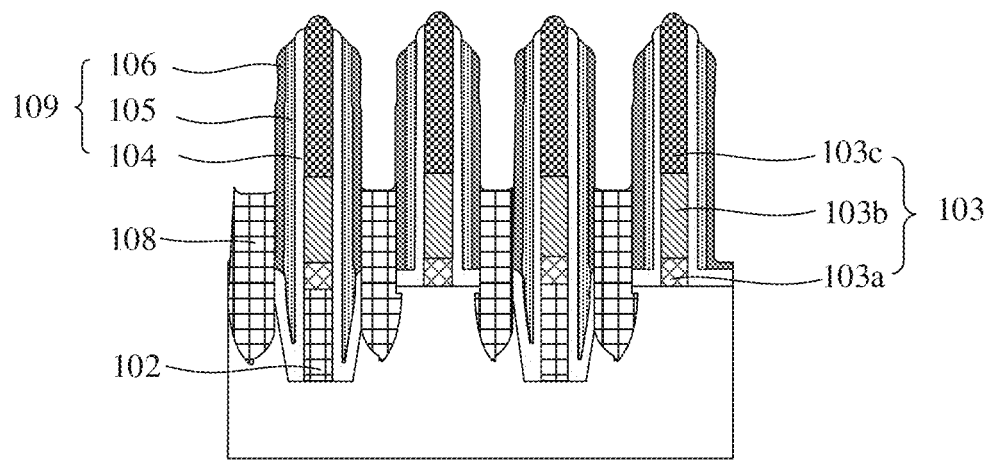

Referring to FIG. 2d, part of the bit line structure 103, part of the first insulating layer 104, part of the second insulating layer 105 and part of the third insulating layer 106 are etched, to enable the remaining part of the first insulating layer 104, the remaining part of the second insulating layer 105 and the remaining part of the third insulating layer 106 to form an insulating layer 109 as shown in FIG. 2e.

Figure 3A:
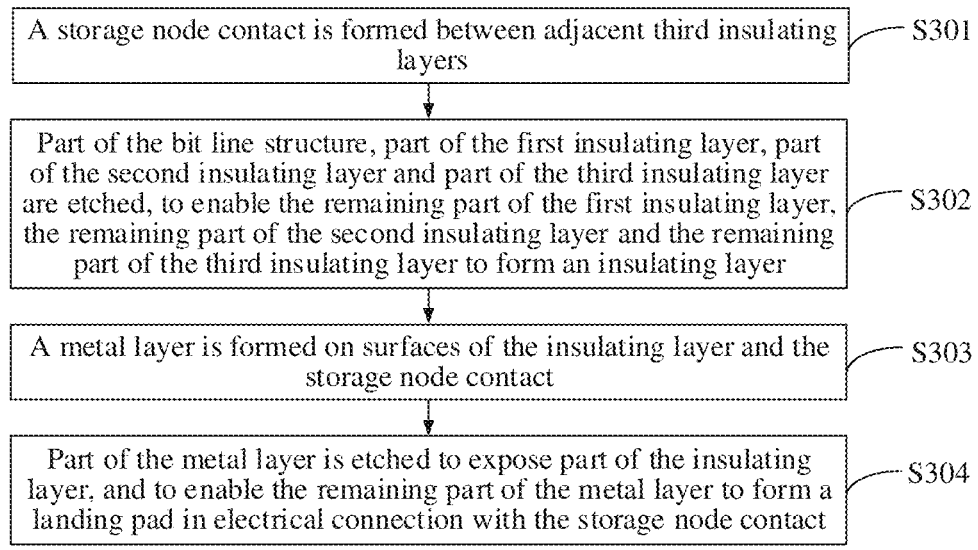
FIG. 3a shows a flowchart of a method for forming a semiconductor structure according to an embodiment of the disclosure.

The embodiments of the disclosure further provide a method for forming a semiconductor structure as shown in FIG. 3a. The method includes the following operations.

Steps S101 to S105 shown in FIG. 1a further include the following operations, after S105.

At S301, a storage node contact is formed between adjacent third insulating layers.

At S302, part of the bit line structure, part of the first insulating layer, part of the second insulating layer and part of the third insulating layer are etched, to enable the remaining part of the first insulating layer, the remaining part of the second insulating layer and the remaining part of the third insulating layer to form an insulating layer.

Steps S301 and S302 are the same as steps S203 and S204, respectively, and references may be made to FIGS. 2d and 2e, respectively.

At S303, a metal layer is formed on surfaces of the insulating layer and the storage node contact.

Here, the material used for the metal layer may be a conductive material such as Wolframium (W). The conductive material is deposited by using Plasma Enhanced Chemical Vapor Deposition (PECVD) process to avoid voids during filling. In some embodiments, the conductive material may also be deposited by using a suitable process such as a chemical vapor deposition process, a low pressure chemical vapor deposition process, or atomic layer deposition.

Figure 3B:
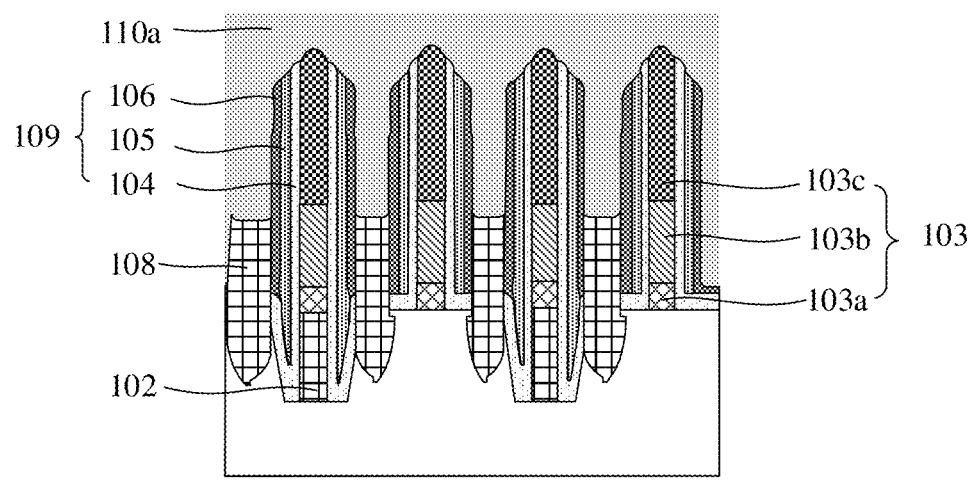
FIGS. 3b, 3c, 3d, 3e, 3f, 3g, 3h, 3i, 3j, 3k schematically show another structures of forming a semiconductor structure according to an embodiment of the disclosure.

For S303, references may be made to FIG. 3b, a metal layer 110a is formed on surfaces of the insulating layer 109 and the storage node contact 108.

At S304, part of the metal layer is etched to expose part of the insulating layer, and to enable the remaining part of the metal layer to form a landing pad in electrical connection with the storage node contact.

Here, the metal layer may be selectively etched by using a dry etching process or a wet etching process. An etching gas may be $HBr/Cl_2$. The landing pad serves to electrically connect the storage node contact to a capacitor.

Figure 3C:
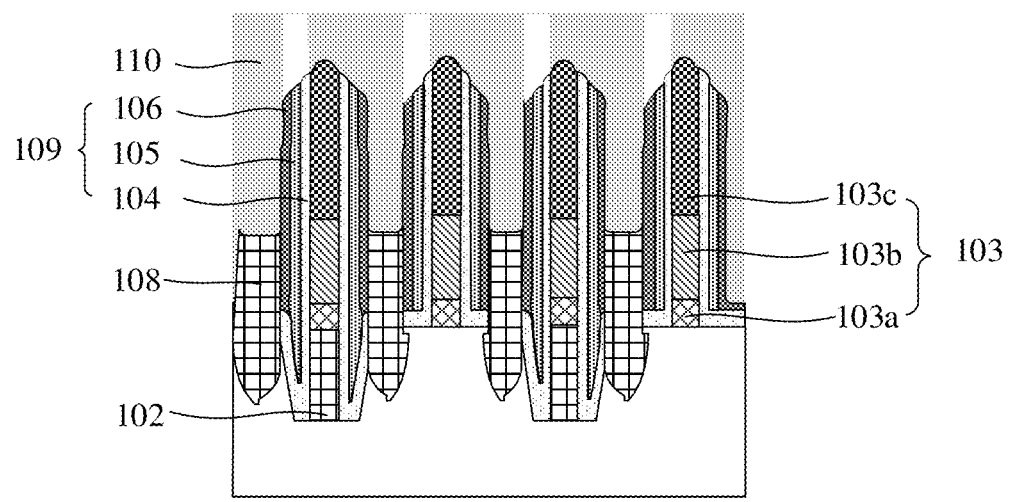

References may be made to FIGS. 3b and 3c for step S304. Referring to FIG. 3b, part of the metal layer 110a is etched to expose part of the insulating layer 109, and the remaining part of the metal layer 110a forms a landing pad 110 as shown in FIG. 3c in electrical connection with the storage node contact 108.

Figure 3D:
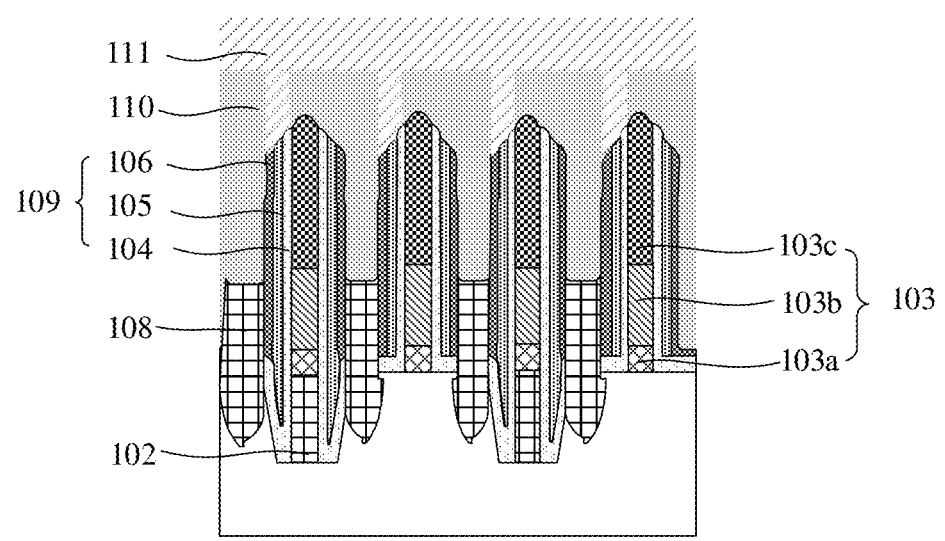

In some embodiments, the method may further include S305, after S304. Referring to FIG. 3d, an isolation structure 111 is formed between adjacent landing pads 110 and on the surfaces of the landing pads 110.

Here, the material of the isolation structure may be silicon oxide, silicon nitride (for example, silicon nitride ($Si_3N_4$)) or silicon oxynitride, etc.

In some possible embodiments, the method may further include the following operations, after S302.

Figure 3E:
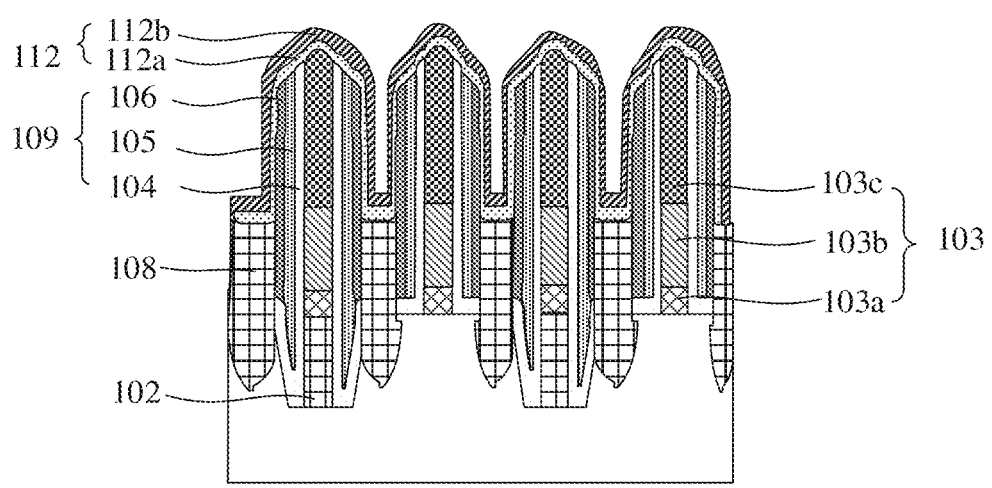

At step A1, referring to FIG. 3e, at least two barrier layers 112 are formed on the surfaces of the storage node contact 108, the bit line structure 103 and the insulating layer 109. Here, the at least two barrier layers 112 include a first barrier layer 112a and a second barrier layer 112b formed in sequence.

Figure 3F:
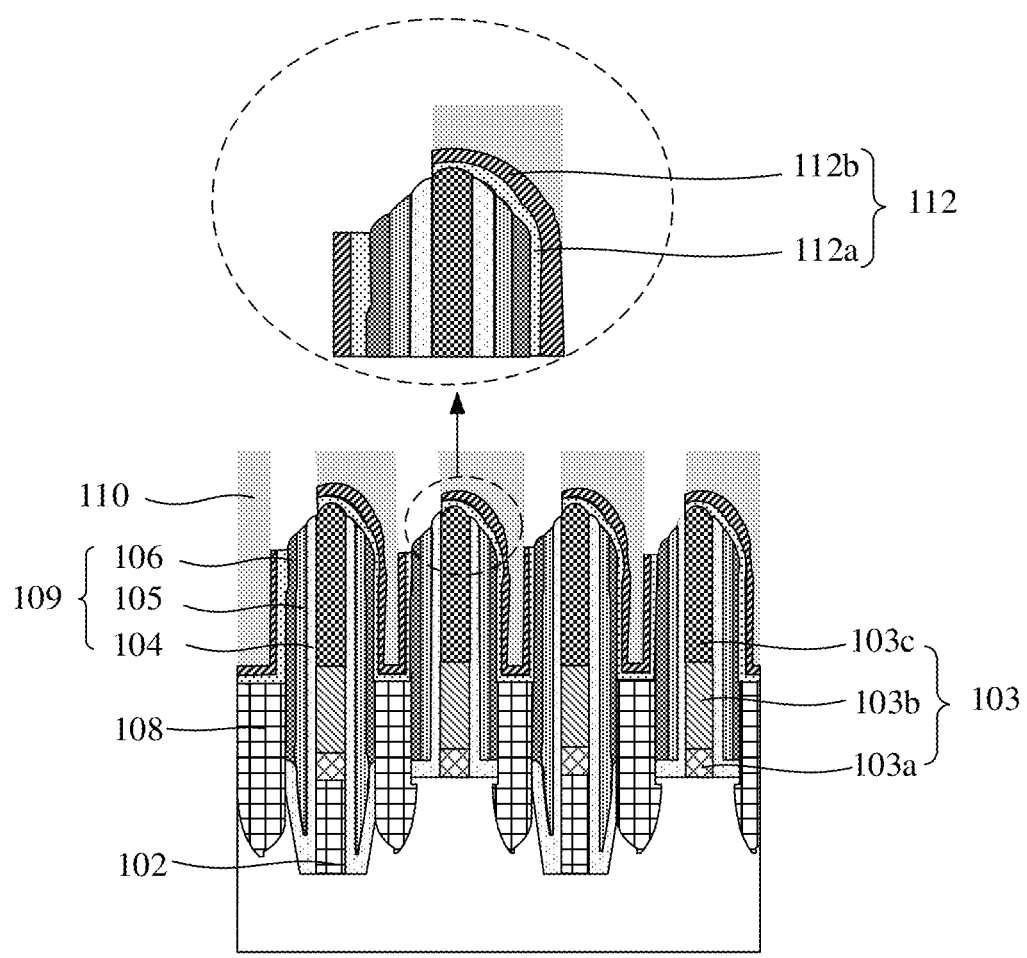

Correspondingly, step S304 includes operation 304a. Referring to FIGS. 3b and 3e, part of the metal layer 110a and part of the at least two barrier layers 112 are etched to expose part of the insulating layer 109, and the remaining part of the metal layer 110a forms the landing pad 110 as shown in FIG. 3f in electrical connection with the storage node contact 108. Step S305 may then be performed to form an isolation structure 111 between adjacent landing pads 110 and on the surface of the landing pads 110, obtaining a structure shown in FIG. 3g.

In practical applications, the barrier layer may be formed by a material selected from titanium (Ti), titanium nitride (TiN), tantalum (Ta), tantalum nitride (TaN), and stacked structures thereof. For example, the material used for the first barrier layer may be Ti, and the material used for the second barrier layer may be TiN.

In some embodiments, step A1 includes step A11 and step A12.

At step A11, a storage node ohmic layer is formed on the storage node contact.

At step A12, at least two barrier layers are formed on the surfaces of the storage node ohmic layer, the bit line structure, and the insulating layer.

Figure 3G:
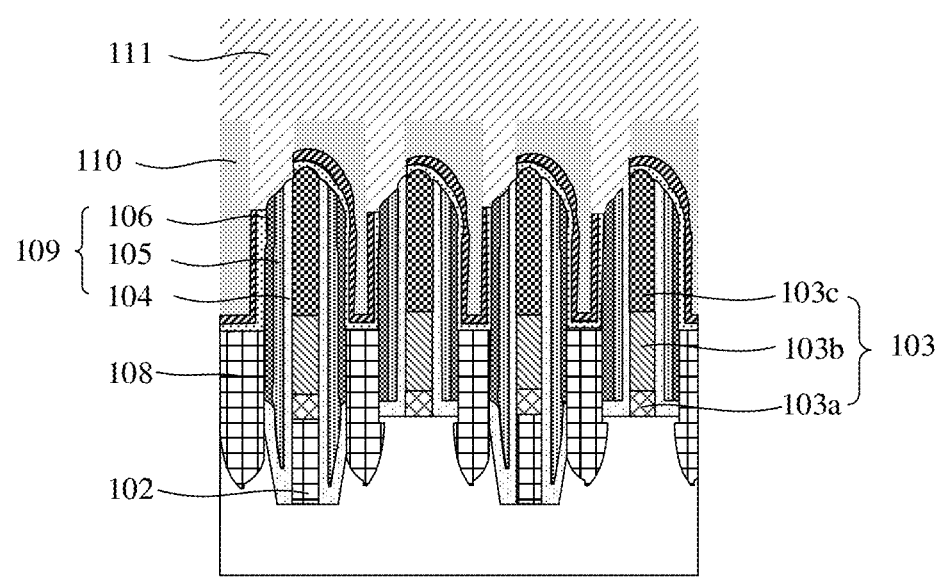
Figure 3H:
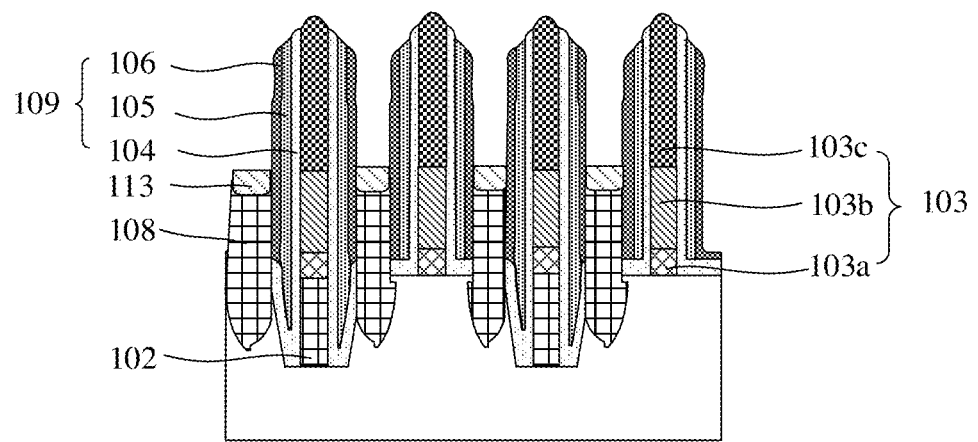
Figure 3I:
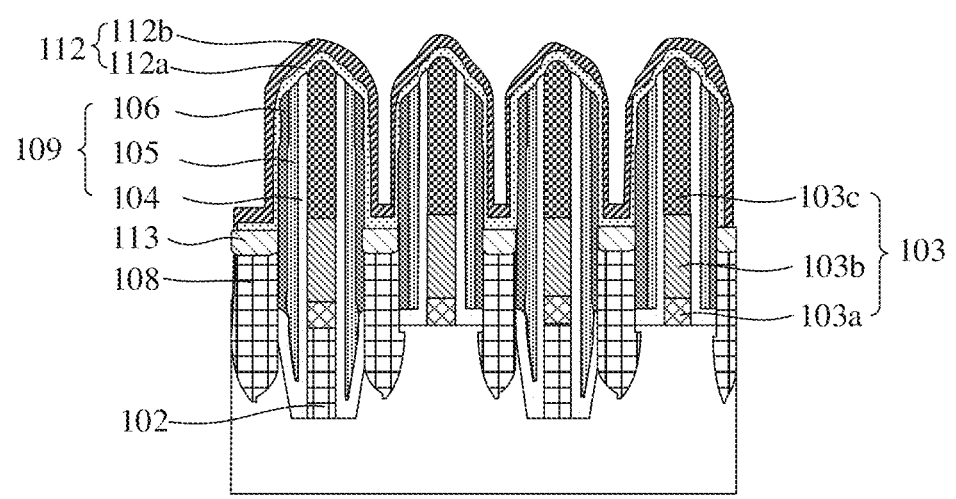
Figure 3J:
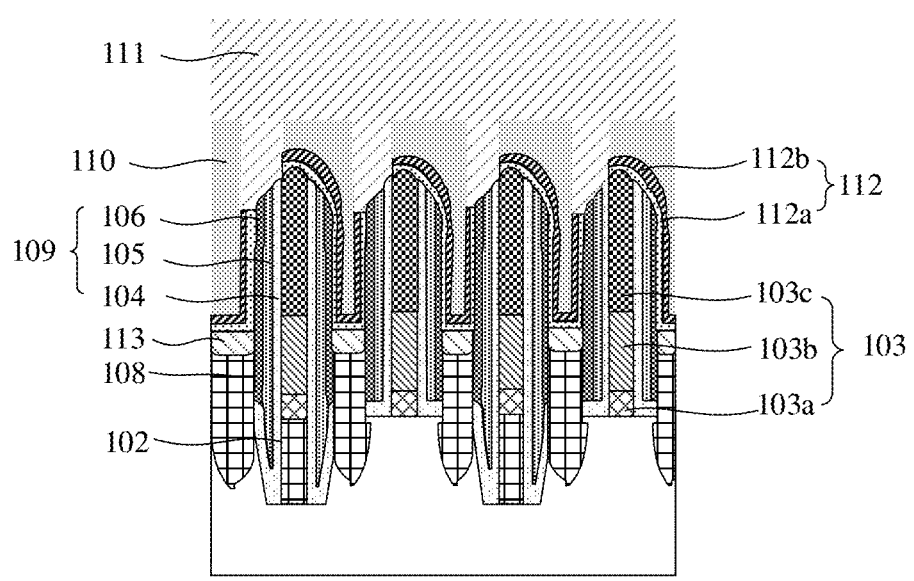

Referring to FIG. 3h, a storage node ohmic layer 113 is formed on the storage node contact 108. Referring to FIG. 3i, at least two barrier layers 112 are formed on the surfaces of the storage node ohmic layer 113, the bit line structure 103, and the insulating layer 109. After step A12, step S303, step 304a and step S305 may be performed to obtain a structure as shown in FIG. 3j.

In practical applications, the storage node ohmic layer may reduce contact resistance between the storage node contact and the landing pad. The material used for the storage node ohmic layer may be at least one of cobalt silicides ($CoSi_x$), nickel silicides ($NiSi_x$) and manganese silicides ($MnSi_x$).

In some embodiments, referring to FIG. 1e, the bit line structure 103 may include the diffusion barrier layer 103a, the conductive layer 103b, and the insulating capping layer 103c. The diffusion barrier layer 103a is located between the bit line contact 102 and the conductive layer 103b, and the insulating capping layer 103c is located on the conductive layer 103b. Accordingly, the operation of etching part of the bit line structure 103 in step S302 includes that: part of the insulating capping layer 103c is etched. As shown in FIG. 3j, the insulating capping layer 103c forms a convex structure after being etched.

Figure 4A:
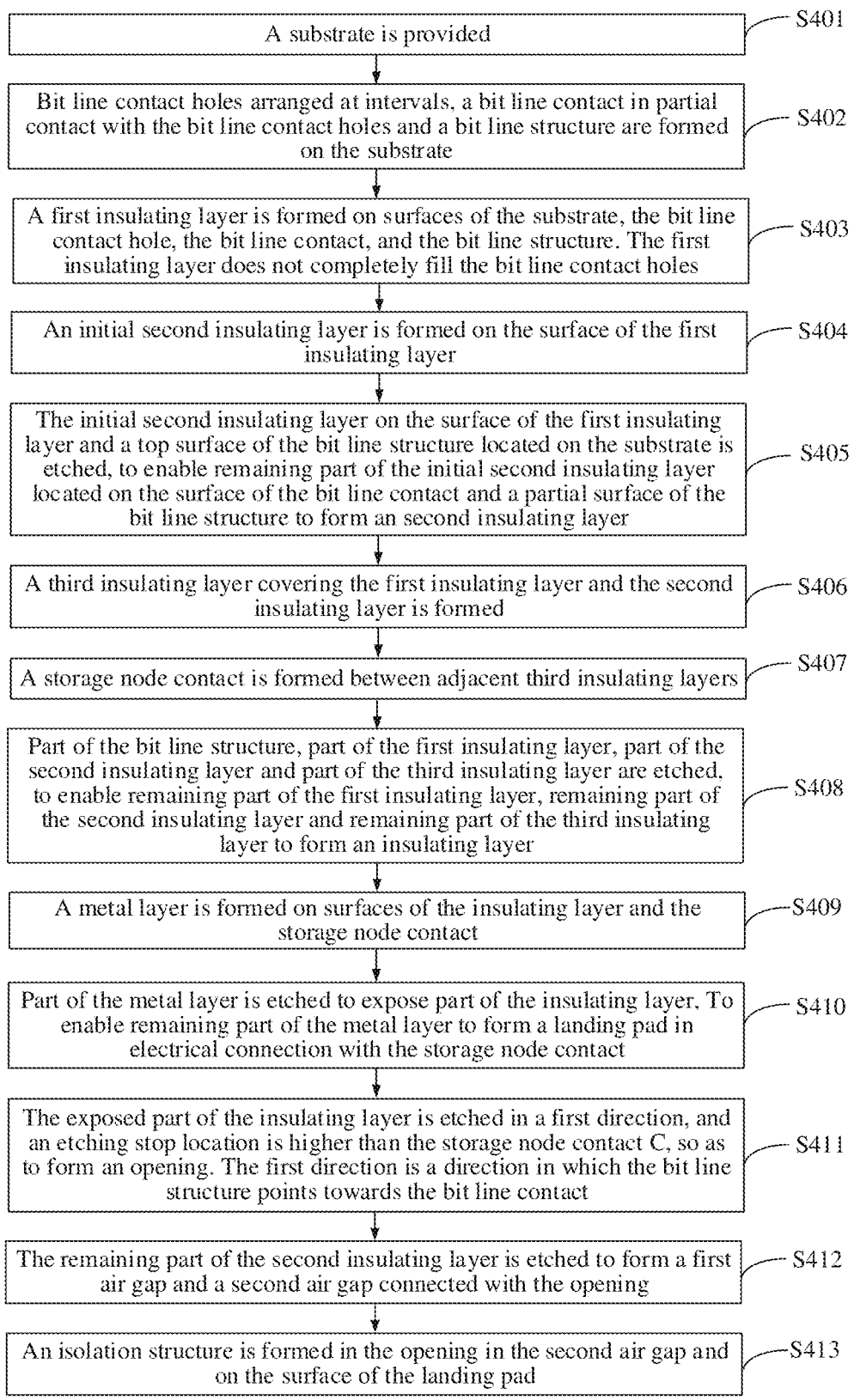
FIG. 4a shows a flowchart of a method for forming a semiconductor structure according to an embodiment of the disclosure.

The embodiments of the disclosure further provide a method for forming a semiconductor structure as shown in FIG. 4a. The method includes the following steps.

At S401, a substrate is provided.

At S402, bit line contact holes arranged at intervals, a bit line contact in partial contact with the bit line contact hole and a bit line structure are formed on the substrate.

At S403, a first insulating layer is formed on surfaces of the substrate, the bit line contact hole, the bit line contact, and the bit line structure. Herein, the first insulating layer does not completely fill the bit line contact hole.

Here, steps S401 to S403 are the same as steps S101 to S103, and may be understood with reference to steps S101 to S103.

At S404, an initial second insulating layer is formed on the surface of the first insulating layer.

Here, the first insulating layer and the initial second insulating layer fill the bit line contact hole.

At S405, the initial second insulating layer on the surface of the first insulating layer and a top surface of the bit line structure located on the substrate is etched, to enable the remaining part of the initial second insulating layer located on the surface of the bit line contact and a part of the surface of the bit line structure to form the second insulating layer.

Here, the initial second insulating layer on the surface of the first insulating layer and the top surface of the bit line structure may be etched by using a dry etching process. In some embodiments, part of the initial second insulating layer above the sidewall of the bit line structure may also be etched.

At S406, a third insulating layer covering the first insulating layer and the second insulating layer is formed.

At S407, a storage node contact is formed between adjacent third insulating layers.

At S408, part of the bit line structure, part of the first insulating layer, part of the second insulating layer and part of the third insulating layer are etched, to enable the remaining part of the first insulating layer, the remaining part of the second insulating layer and the remaining part of the third insulating layer to form an insulating layer.

At S409, a metal layer is formed on surfaces of the insulating layer and the storage node contact.

At S410, part of the metal layer is etched, to expose part of the insulating layer and to enable the remaining part of the metal layer to form a landing pad in electrical connection with the storage node contact.

At S411, the exposed part of the insulating layer is etched along a first direction, and an etching stop location is higher than the storage node contact, so as to form an opening. Herein, the first direction is a direction in which the bit line structure points towards the bit line contact.

Here, the substrate may include a top surface at a front face and a bottom surface at a back face opposite to the front face. The direction perpendicular to the top and bottom surfaces of the substrate is defined as the first direction, ignoring the flatness of the top and bottom surfaces. Two directions of the top surface and the bottom surface of the substrate (that is, a plane in which the substrate is located) intersecting each other (for example, perpendicular to each other) are defines as a second direction and a third direction. For example, the extending direction of the opening may be defined as the first direction, and the plane direction of the substrate may be determined based on the second direction and the third direction. The first direction, the second direction, and the third direction are perpendicular in pairs. In the embodiment of the disclosure, the first direction is defined as X-axis direction, the second direction is defined as Y-axis direction, and the third direction is defined as Z-axis direction.

In some embodiments, the exposed part of the insulating layer may be etched by using a dry etching process. At S410, part of the insulating layer is exposed first, and the insulating layer continues to be etched at S411. Thus, the remaining part of the second insulating layer exposed by etching through two steps, which facilitates preventing the sidewall from tipping over.

At S412, the remaining part of the second insulating layer is etched to form a first air gap and a second air gap connected with the opening.

Here, the remaining part of the second insulating layer may be etched by using a wet method in the X-axis direction and the Z-axis direction. The first insulating layer or the third insulating layer on either side of the opening may play a protective role. For example, when residual etching solution is removed by acid pickling after wet etching, the first insulating layer or the third insulating layer on either side of the opening may prevent an acid solution used in the acid pickling process from damaging the storage node contact, the bit line structure, and the bit line contact, which in turn can reduce influence on the conductivity thereof.

At S413, an isolation structure is formed in the opening in the second air gap and on the surface of the landing pad.

FIGS. 4b-4e schematically show another structures of forming a semiconductor structure according to an embodiment of the disclosure. Further description is made below to steps S402 to S405 with reference to FIGS. 4b to 4e.

Figure 4B:
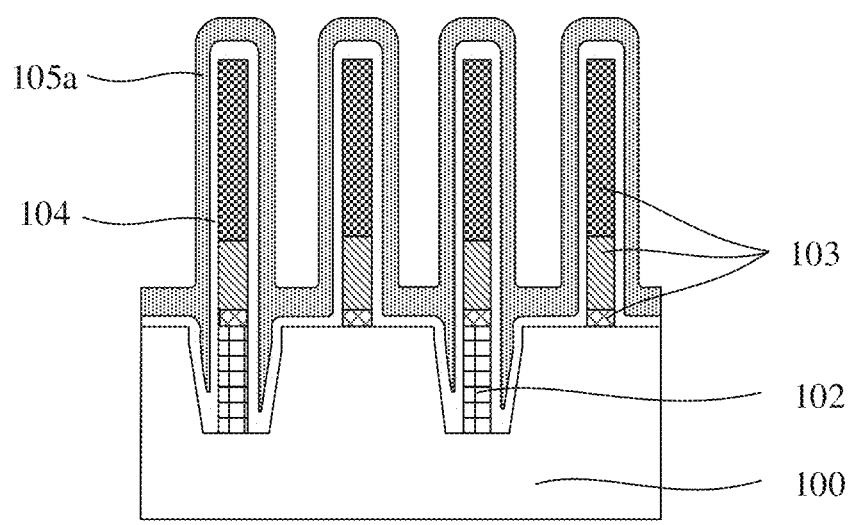
FIGS. 4b, 4c, 4d, 4e schematically show another structures of forming a semiconductor structure according to an embodiment of the disclosure.

At S404, referring to FIG. 4b, an initial second insulating layer 105 is formed on the surface of the first insulating layer 104. The second insulating layer 105 as shown in FIG. 1d may be obtained after S405. That is, the second insulating layer 105 is located on, as shown in FIG. 1c, the sidewalls of the void 101a and the first insulating layer.

A third insulating layer 106 as shown in FIG. 1e is formed after S406.

A storage node contact 108 as shown in FIG. 2d is formed after S407.

Here, after forming the storage node contact, the method may further includes step A1 that, at least two barrier layers are formed on the surfaces of the storage node contact, the bit line structure, and the insulating layer. Step A1 may be implemented by step A11 and step A12.

At step A11, a storage node ohmic layer is formed on the storage node contact.

At step A12, at least two barrier layers are formed on the surfaces of the storage node ohmic layer, the bit line structure, and the insulating layer.

Referring to FIG. 3h, a storage node ohmic layer 113 is formed on the storage node contact 108. Referring to FIG. 3i, at least two barrier layers 112 are formed on the surfaces of the storage node ohmic layer 113, the bit line structure 103, and the insulating layer 109. The at least two barrier layers 112 include a first barrier layer 112a and a second barrier layer 112b formed in sequence.

An insulating layer 109 as shown in FIG. 2e is formed after S408. The insulating layer 109 includes the remaining part of first insulating layer 104, the remaining part of second insulating layer 105 and the remaining part of third insulating layer 106.

After step S409, a metal layer 110a as shown in FIG. 3b is formed. In addition, the metal layer 110a has a height greater than a height of the insulating layer 109.

Figure 3K:
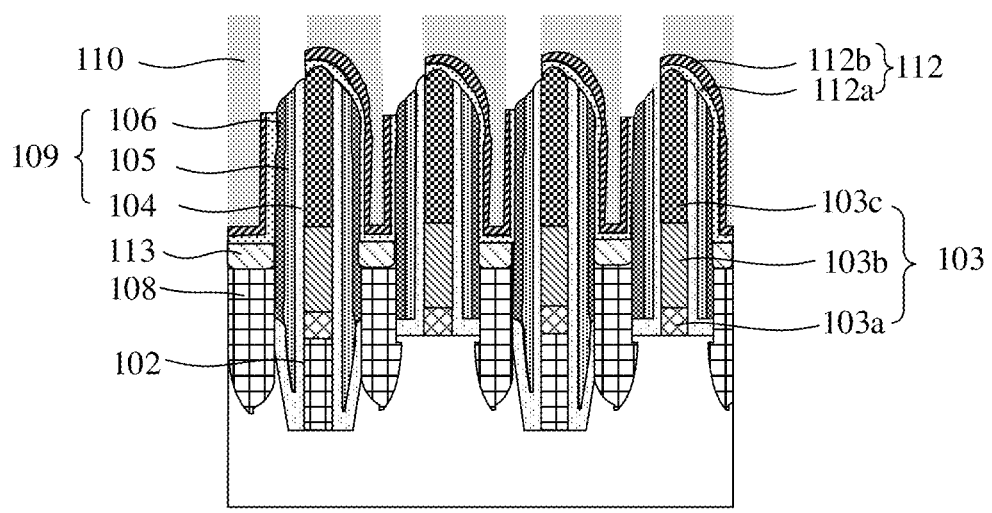

A landing pad 110 as shown in FIG. 3k is formed after S410.

Figure 4C:
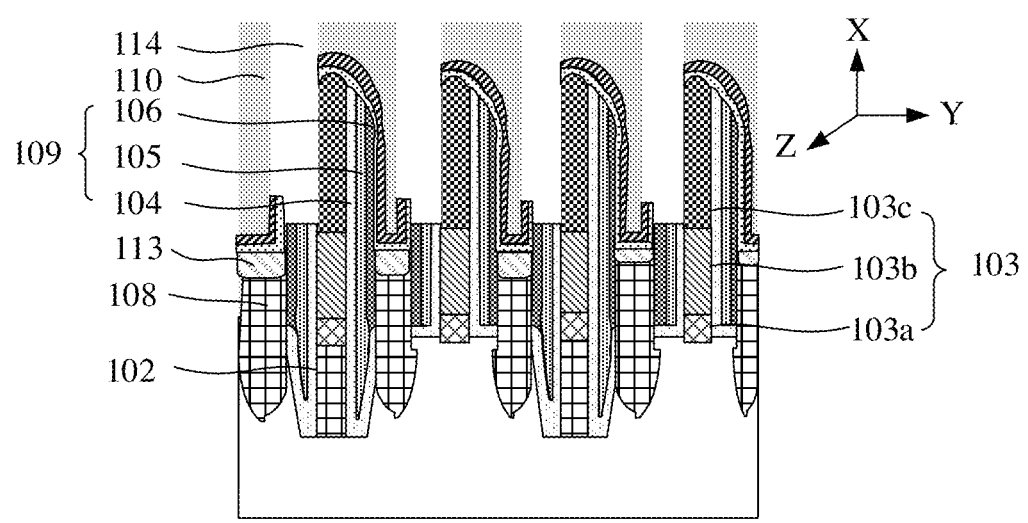

At S411, referring to FIG. 3k, the exposed part of the insulating layer 109 is etched along the X-axis direction, and an etching stop location of the insulating layer 109 is higher than the storage node ohmic layer 113 and the storage node contact 108, so as to form an opening 114 as shown in FIG. 4c. Here, the etching rate of the barrier layer 112 is not greater than the etching rate of the insulating layer 109 to further ensure that the storage node ohmic layer 113 and the storage node contact 108 are not exposed to the opening 114.

Figure 4D:
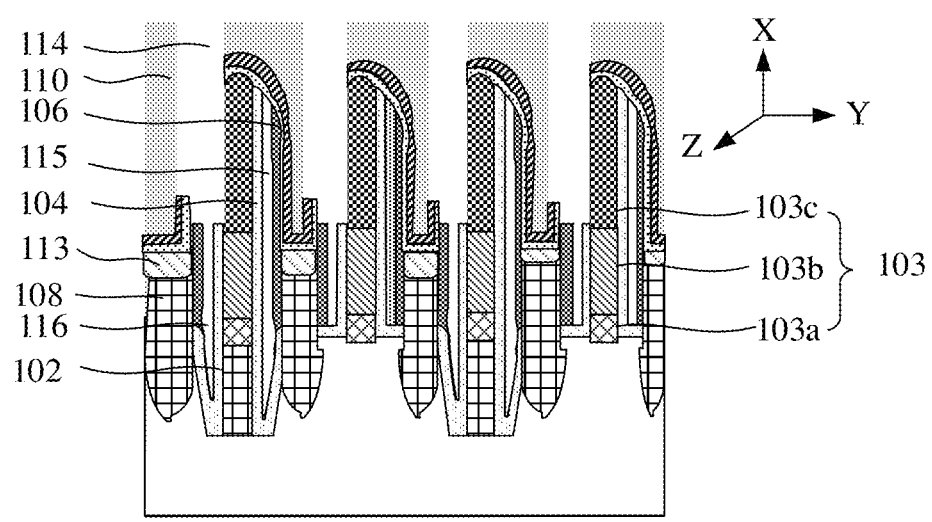

At S412, referring to FIG. 4c, the remaining part of the second insulating layer 105 is etched to form as shown in FIG. 4d, a first air gap 115, and a second air gap 116 connected with the opening 114.

Figure 4E:
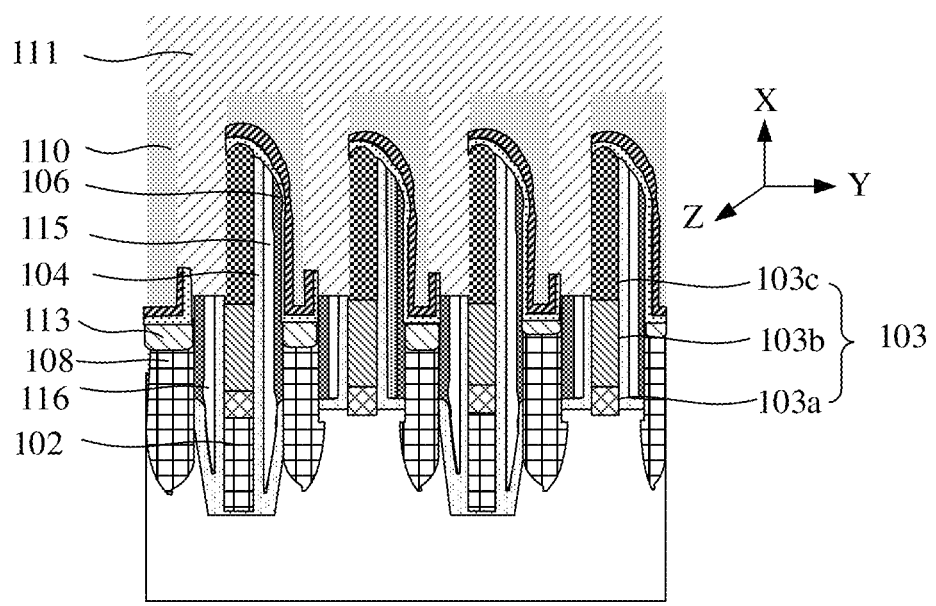

At S413, referring to FIG. 4d, an isolation structure 111 as shown in FIG. 4e is formed in the opening 114 in the second air gap 116 and on the surface of the landing pad 110.

In some embodiments, step S413 may include step S413a and step S413b.

At S413a, a first filling layer is deposited at a sidewall of the opening, at an interface of the opening connected with the second air gap, and on the surface of the landing pad. Herein, the first filling layer seals the opening of the second air gap to form the second air gap sealed.

At S413b, a second filling layer is deposited on a surface of the first filling layer.

Here, the material used for the first filling layer may be the same as the material used for the second filling layer, and may both be silicon nitride. The first filling layer seals the second air gap first, and then the second filling layer fills the opening, thus forming an isolation structure by filling in two times to avoid filling defects.

The embodiments of the disclosure provide a semiconductor structure. As shown in FIG. 3g, the structure includes: a substrate 100; bit line contact holes arranged at intervals, a bit line contact 102 in partial contact with the bit line contact hole and a bit line structure 103, which are located on the substrate 100; an insulating layer 109 located on two sidewalls of the bit line contact 102 and the bit line structure 103, the insulating layer 109 including a first insulating layer 104, a second insulating layer 105 and a third insulating layer 106 which are stacked in sequence, and the insulating layer 109 at least on a first sidewall including a first insulating layer 104, a second insulating layer 105 and a third insulating layer 106 whose heights decrease in sequence; a storage node contact 108 located between adjacent third insulating layers 106; a landing pad 110 covering the storage node contact 108 and the surface of the insulating layer 109 on the first sidewall, the landing pad 110 being in electrical connection with the storage node contact 108; and an isolation structure 111 located between adjacent landing pads 110 and on surfaces of the landing pads 110.

In some embodiments, the material of the first insulating layer includes a nitride, and the material of the third insulating layer is the same as the material of the first insulating layer. Here, the nitride may be silicon nitride.

In some embodiments, the semiconductor structure shown in FIG. 3d is formed based on a method for forming a semiconductor structure shown in FIG. 3a. Referring to FIG. 3d, the insulating layer 109 on a second sidewall of the two sidewalls includes a first insulating layer 104, a second insulating layer 105, and a third insulating layer 106 whose heights decrease in sequence. The material of the second insulating layer 105 includes an oxide. Here, the oxide may be silicon oxide.

In some embodiments, referring to FIG. 3g, the structure further includes: at least two barrier layers 112 located among the insulating layer 109, the bit line structure 103, and the landing pad 110.

In some embodiments, referring to FIG. 3j, the structure further includes: a storage node ohmic layer 113 located between the storage node contact 108 and the at least two barrier layers 112.

In some embodiments, a semiconductor structure shown in FIG. 4e is formed based on a method for forming a semiconductor structure shown in FIG. 4a. Referring to FIG. 4e, the material of the first insulating layer 104 includes a nitride, and the material of the third insulating layer 106 is the same as the material of the first insulating layer 104. The insulating layer 109 on a second sidewall of the two sidewalls includes a first insulating layer 104, a second insulating layer 105 and a third insulating layer 106 which have the same height. The second insulating layer 105 includes an air gap 116. Here, the nitride may be silicon nitride.

The features described in the several method or structure embodiments provided in the present disclosure can be arbitrarily combined without conflict to obtain a new method embodiment or structure embodiment.

Descriptions about the above semiconductor structure embodiments are similar to descriptions about the method embodiments and beneficial effects similar to those of the method embodiments can be achieved. Technical details undisclosed in the semiconductor structure embodiments of the disclosure can be understood with reference to the descriptions about the method embodiments of the disclosure.

The above is only exemplary embodiments of the disclosure and not intended to limit the protection scope of the disclosure. Any modifications, equivalent replacements, improvements and the like made within the spirit and principle of the disclosure shall fall within the protection scope of the disclosure.

INDUSTRIAL PRACTICABILITY

By forming a first insulating layer on surfaces of a substrate, a bit line contact hole, a bit line contact, and a Bit line structure, forming a second insulating layer on the surface of the first insulating layer located on the surface of the bit line contact and part of the surface of the bit line structure, and forming a third insulating layer covering the first insulating layer and the second insulating layer, the embodiments of the disclosure provides a new method for forming a sidewall structure of a bit line (B L) and a bit line contact (BLC) structure, which can reduce parasitic capacitance from the BL and the bit line contact to a storage node contact (SNC), and improve reading capacity.

The invention claimed is:

1. A method for forming a semiconductor structure, comprising:
providing a substrate;
forming bit line contact holes arranged at intervals, a bit line contact in partial contact with the bit line contact hole and a bit line structure on the substrate;
forming a first insulating layer on a surface of the substrate, a surface of the bit line contact hole, a surface of the bit line contact, and a surface of the bit line structure, wherein the first insulating layer does not completely fill the bit line contact hole;
forming a second insulating layer on a surface of the first insulating layer located on the surface of the bit line contact and part of the surface of the bit line structure; and
forming a third insulating layer covering the first insulating layer and the second insulating layer;
forming a storage node contact between adjacent third insulating layers; and
etching part of the bit line structure, part of the first insulating layer, part of the second insulating layer and part of the third insulating layer, to enable remaining part of the first insulating layer, remaining part of the second insulating layer and remaining part of the third insulating layer to form an insulating layer;
forming a metal layer on surfaces of the insulating layer and the storage node contact; and
etching part of the metal layer to expose part of the insulating layer, and to enable remaining part of the metal layer to form a landing pad in electrical connection with the storage node contact;
etching the exposed part of the insulating layer along a first direction, wherein an etching stop location is higher than the storage node contact, so as to form an opening, wherein the first direction is a direction in which the bit line structure points towards the bit line contact;
etching the remaining part of the second insulating layer to form a first air gap and a second air gap connected with the opening; and
forming an isolation structure in the opening in the second air gap and on the surface of the landing pad.

2. The method of claim 1, further comprising:
forming an isolation structure between adjacent landing pads and on surfaces of the landing pads.

3. The method of claim 1, wherein the isolation structure comprises a first filling layer and a second filling layer, wherein the formation of the isolation structure in the opening in the second air gap and on the surface of the landing pad comprises:
depositing the first filling layer at a sidewall of the opening, at an interface of the opening connected with the second air gap, and on the surface of the landing pad, wherein the first filling layer seals the opening of the second air gap to make the second air gap sealed; and
depositing the second filling layer on a surface of the first filling layer.

4. The method of claim 1, before forming the storage node contact between adjacent third insulating layers, further comprising:
forming a fourth insulating layer on a surface of the third insulating layer; and
etching the fourth insulating layer, the third insulating layer located on the surface of the substrate and part of the substrate to expose the substrate.

5. The method of claim 1, wherein the formation of the second insulating layer on the surface of the first insulating layer located on the surface of the bit line contact and the surface of the bit line structure comprises:
forming an initial second insulating layer on the surface of the first insulating layer; and
etching the initial second insulating layer on the surface of the first insulating layer and a top surface of the bit line structure located on the substrate, to enable remaining part of the initial second insulating layer located on the surface of the bit line contact and the part of the surface of the bit line structure to form the second insulating layer.

6. The method of claim 1, wherein the bit line structure at least comprises a diffusion barrier layer, a conductive layer, and an insulating capping layer, wherein the diffusion barrier layer is located between the bit line contact and the conductive layer, and the insulating capping layer is located on the conductive layer.

7. The method of claim 6, wherein the etching part of the bit line structure comprises:
    etching part of the insulating capping layer.

8. The method of claim 1, wherein a material of the first insulating layer comprises a nitride, a material of the second insulating layer comprising an oxide, and a material of the third insulating layer is same as the material of the first insulating layer.

9. The method of claim 4, wherein a material of the fourth insulating layer is same as a material of the third insulating layer.

* * * * *